United States Patent
Ujita et al.

(10) Patent No.: US 11,342,832 B2
(45) Date of Patent: May 24, 2022

(54) DRIVING CIRCUIT FOR SEMICONDUCTOR ELEMENT, METHOD FOR DRIVING SEMICONDUCTOR ELEMENT, AND MOTOR CONTROL APPARATUS

(71) Applicant: KABUSHIKI KAISHA YASKAWA DENKI, Kitakyushu (JP)

(72) Inventors: Yu Ujita, Kitakyushu (JP); Masato Higuchi, Kitakyushu (JP); Daisuke Yoshimi, Kitakyushu (JP); Heiji Kaneda, Kitakyushu (JP)

(73) Assignee: KABUSHIKI KAISHA YASKAWA DENKT, Kitakyushu (JP)

( * ) Notice: Subject to any disclaimer, the term of this patent is extended or adjusted under 35 U.S.C. 154(b) by 111 days.

(21) Appl. No.: 16/936,816

(22) Filed: Jul. 23, 2020

(65) Prior Publication Data
US 2020/0350813 A1 Nov. 5, 2020

Related U.S. Application Data

(63) Continuation of application No. PCT/JP2018/003608, filed on Feb. 2, 2018.

(51) Int. Cl.
*H02M 1/08* (2006.01)
*H02P 27/08* (2006.01)
(Continued)

(52) U.S. Cl.
CPC .............. *H02M 1/08* (2013.01); *H02P 27/08* (2013.01); *H03K 17/04106* (2013.01); *H02M 1/0054* (2021.05)

(58) Field of Classification Search
CPC ........ H02P 27/00; H02P 27/04; H02P 27/045; H02P 27/047; H02P 27/06; H02P 27/08;
(Continued)

(56) References Cited

U.S. PATENT DOCUMENTS 10,097,176 B2 * 10/2018 Suzuki ................... H02M 1/08
10,333,509 B2 * 6/2019 Kaeriyama ........ H03K 17/0406
(Continued)

FOREIGN PATENT DOCUMENTS

JP 2005-300170 A 10/2005
JP 2007-228769 A 9/2007
(Continued)

OTHER PUBLICATIONS

Extended European Search Report dated Aug. 10, 2021 in European Patent Application No. 18903189.1, 9 pages.
(Continued)

*Primary Examiner* — Antony M Paul
(74) *Attorney, Agent, or Firm* — Oblon, McClelland, Maier & Neustadt, L.L.P.

(57) ABSTRACT

A driving circuit for a semiconductor circuit which includes a pair of main terminals through which a main current is conducted and a control terminal to which a control voltage is applied to control a circulation state of the main current, includes: driving voltage switching circuitry that receives a control signal, instructs switching between driving voltages based on a change in the control signal, and outputs a driving voltage, among the driving voltages, that has been selected in the switching; low-speed control circuitry that instructs an increase-decrease change in the control voltage at a low speed; speed-increase control circuitry that executes a speed-increase control of increasing a speed of the increase-decrease change made by the low-speed control circuitry; and speed-increase switching circuitry that instructs switching between an execution and a non-execution of the speed-increase control, and instructs switching between levels of a speed-increase change caused by the speed-increase control.

20 Claims, 13 Drawing Sheets

(51) Int. Cl.
*H03K 17/041* (2006.01)
*H02M 1/00* (2006.01)

(58) Field of Classification Search
CPC ...... H02P 27/085; H02P 29/00; H02P 25/062;
H02P 25/064; H02P 21/22; H02P 23/00;
H02P 23/0027; H02P 7/00; H02P 7/05;
H02P 6/28; H02P 6/12; H02P 6/15; H02P
6/00; H02P 1/00; H02P 1/04; H02P 1/12;
H02P 1/16; H02P 1/24; H02P 1/42; H02P
1/426; H02P 1/46; H02P 1/52; H02M
3/156; H02M 7/527
See application file for complete search history.

(56) References Cited

U.S. PATENT DOCUMENTS

| | | |
|---|---|---|
| 2007/0200602 A1 | 8/2007 | Ishikawa et al. |
| 2013/0234778 A1 | 9/2013 | Kuwabara et al. |
| 2017/0373676 A1* | 12/2017 | Kaeriyama ............ H03K 17/14 |

FOREIGN PATENT DOCUMENTS

| | | |
|---|---|---|
| JP | 4713347 B2 | 6/2011 |
| JP | 2013-187955 A | 9/2013 |
| JP | 2016-127686 A | 7/2016 |

OTHER PUBLICATIONS

D. Gerber, et al., "IGBT Gate-Drive With PCB Rogowski Coil for Improved Short Circuit Detection and Current Turn-Off Capability", https://ieeexplore.ieee.org/stampPDF/getPDF.jsp?tp=&arnumber=6191615&ref=, XP055829290, Jun. 19. 2011, 6 pages.

Yang Xue, et al., "A Compact Planar Rogowski Coil Current Sensor for Active Current Balancing of Parallel-Connected Silicon Carbide MOSFETs", 2014 IEEE Energy Conversion Congress and Exposition (ECCE), XP032680397, Sep. 14, 2014, pp. 4685-4690.

International Search Report dated Mar. 27, 2018 in PCT/JP2018/003608 filed Feb. 2, 2018, 4 pages.

* cited by examiner

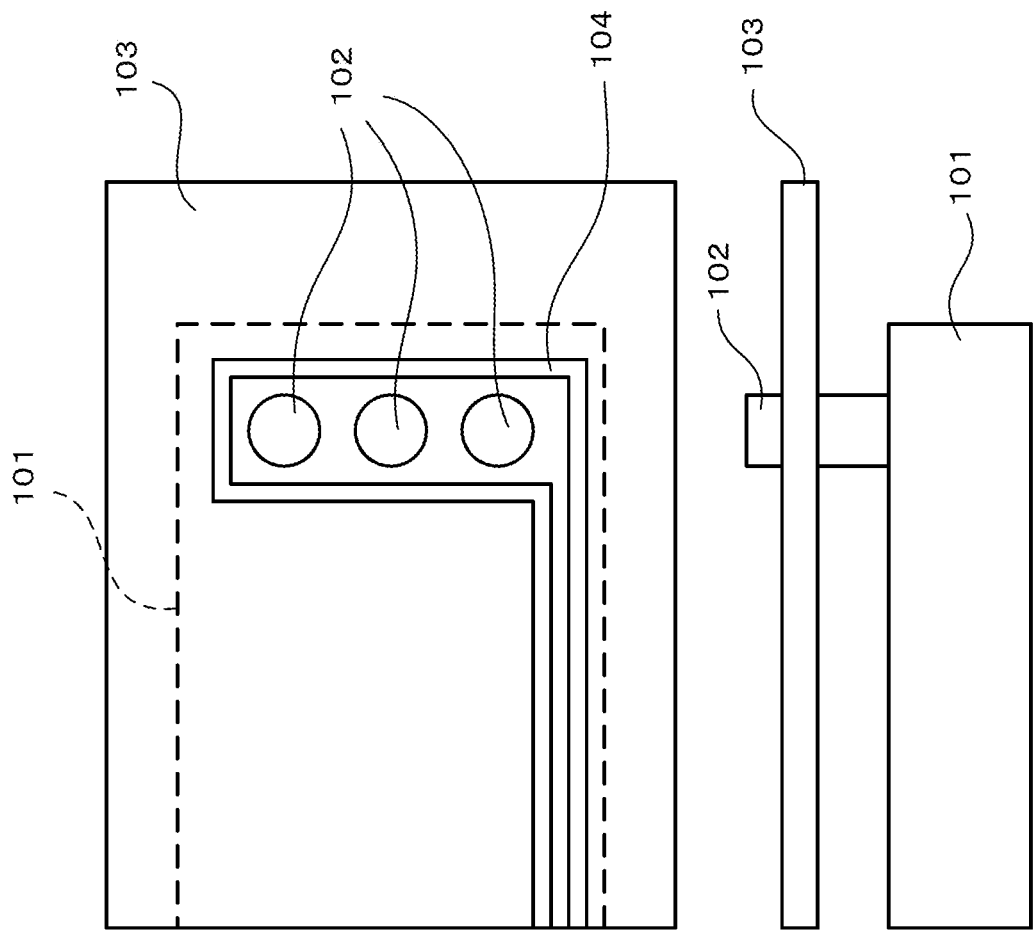

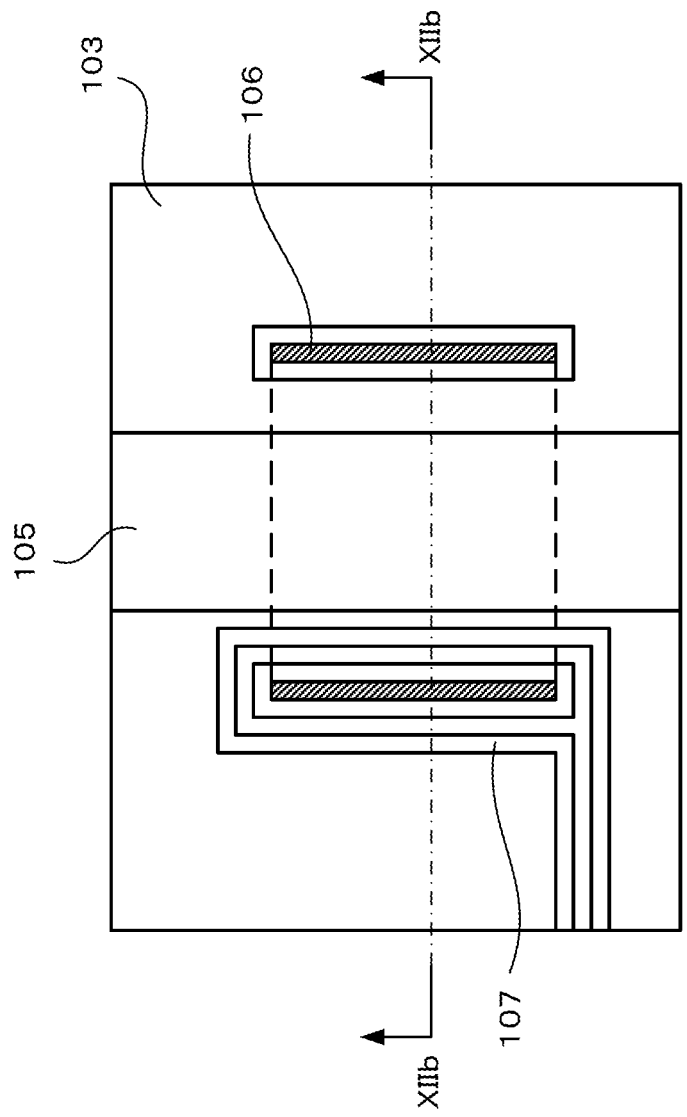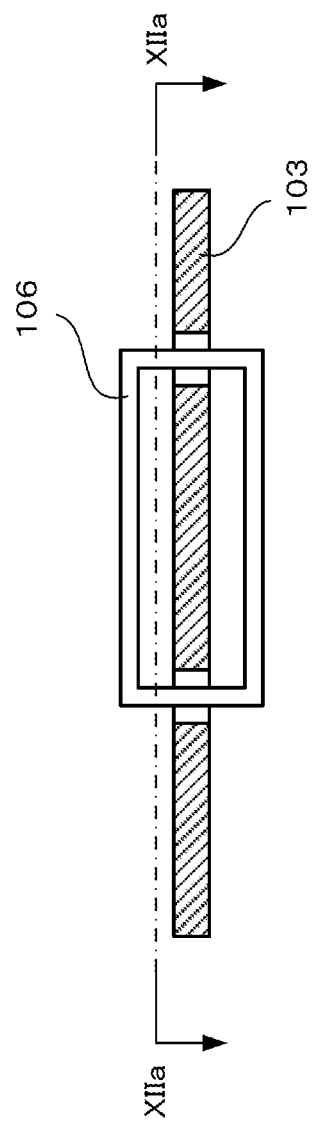
FIG. 12A
FIG. 12B

DRIVING CIRCUIT FOR SEMICONDUCTOR ELEMENT, METHOD FOR DRIVING SEMICONDUCTOR ELEMENT, AND MOTOR CONTROL APPARATUS

CROSS-REFERENCE TO RELATED APPLICATIONS

The present application is a continuation application of International Application No. PCT/JP2018/003608, filed Feb. 2, 2018. The contents of this application are incorporated herein by reference in their entirety.

BACKGROUND

Field of the Invention

The embodiments disclosed herein relate to a driving circuit for a semiconductor element, a method for driving a semiconductor element, and a motor control apparatus using the driving circuit and/or the method.

Discussion of the Background

JP 4713347B discloses a configuration of a driving circuit that controls the switching speed of a switching element based on a conduction state of main current.

SUMMARY

According to one aspect of the present invention, a driving circuit for a semiconductor circuit including a pair of main terminals through which a main current is conducted and a control terminal to which a control voltage is applied to control a circulation state of the main current, includes: driving voltage switching circuitry that receives a control signal, instructs switching between driving voltages based on a change in the control signal, and outputs a driving voltage, among the driving voltages, that has been selected in the switching; low-speed control circuitry that instructs an increase-decrease change in the control voltage at a low speed; speed-increase control circuitry that executes a speed-increase control of increasing a speed of the increase-decrease change made by the low-speed control circuitry; and speed-increase switching circuitry that instructs switching between an execution and a non-execution of the speed-increase control, and instructs switching between levels of a speed-increase change caused by the speed-increase control.

According to another aspect of the present invention, a motor control apparatus includes: a semiconductor circuit that performs a power conversion of DC power into AC power supplied to a motor, and includes a pair of main terminals through which a main current is conducted, and a control terminal to which a control voltage is applied to control a circulation state of the main current; a driving circuit that drives the semiconductor circuit and includes driving voltage switching circuitry that receives a control signal, instructs switching between driving voltages based on a change in the control signal, and outputs a driving voltage, among the driving voltages, that has been selected in the switching, low-speed control circuitry that instructs an increase-decrease change in the control voltage at a low speed, speed-increase control circuitry that executes a speed-increase control of increasing a speed of the increase-decrease change made by the low-speed control circuitry, and speed-increase switching circuitry that instructs switching between an execution and a non-execution of the speed-increase control, and instructs switching between levels of a speed-increase change caused by the speed-increase control; and control circuitry that outputs the control signal. The semiconductor circuit further performs the power conversion by controlling the circulation state of the main current.

According to yet another aspect of the present invention, a method for driving a semiconductor circuit including a pair of main terminals through which a main current is conducted and a control terminal to which a control voltage is applied to control a circulation state of the main current, includes: receiving a control signal; switching between driving voltages based on a change in the control signal; outputting a driving voltage, among the driving voltages, that has been selected in the switching; executing an increase-decrease change in the control voltage at a low speed; switching between an execution and a non-execution of speed-increase control; and when executing speed-increase control, increasing a speed of the executed increase-decrease change in the control voltage and switching between levels of the executed speed-increase change caused by the speed-increase control.

BRIEF DESCRIPTION OF THE DRAWINGS

A more complete appreciation of the present disclosure and many of the attendant advantages thereof will be readily obtained as the same becomes better understood by reference to the following detailed description when considered in connection with the accompanying drawings, wherein:

FIGS. 11A and 11B are diagrams illustrating an example configuration in which a conduction detection device is implemented by a search coil;

FIGS. 12A and 12B are diagrams illustrating an example configuration in which the conduction detection device is implemented by a transformer.

DESCRIPTION OF THE EMBODIMENTS

Figure 1:
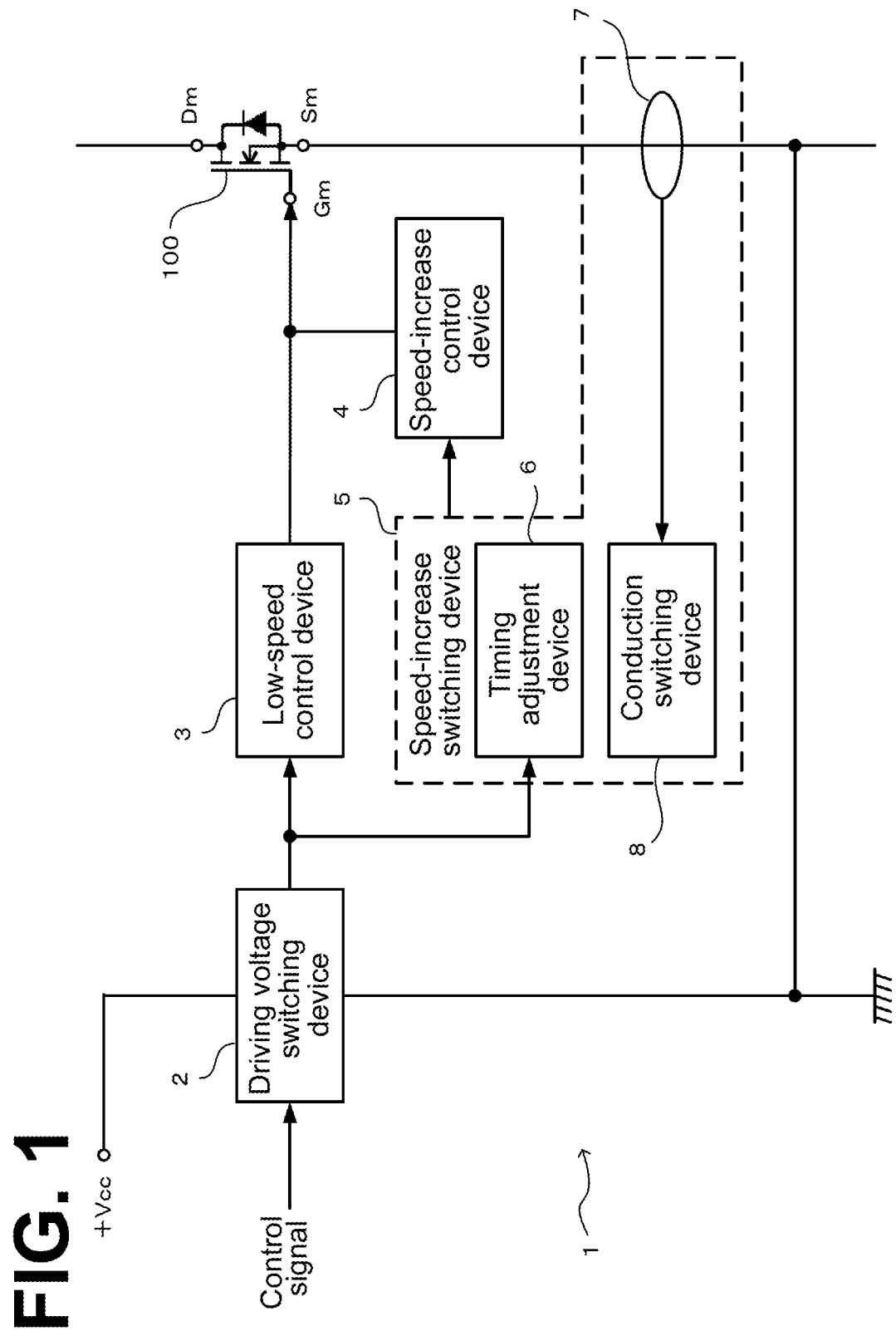
FIG. 1 is a control block diagram schematically illustrating content of control executed by a driving circuit according to one embodiment.

The embodiments will now be described with reference to the accompanying drawings, wherein like reference numerals designate corresponding or identical elements throughout the various drawings.

Control Configuration Example of Driving Circuit for Semiconductor Element

By referring to FIG. 1, an example of a control configuration of a driving circuit according to this embodiment for a semiconductor element will be described.

In FIG. 1, content of control executed by the driving circuit according to this embodiment for a semiconductor element is schematically illustrated in the form of a control block diagram. In this embodiment, a MOSFET is used as the semiconductor element, which is a driving target. The MOSFET is provided in a main circuit, and is subjected to switching control, between turn-ON and turn-OFF, by applying a gate voltage (control voltage) between the gate terminal and the source terminal. The driving circuit controls an over-time increase-decrease change in the gate voltage. Referring to FIG. 1, the driving circuit, 1, includes a driving voltage switching device 2, a low-speed control device 3, a speed-increase control device 4, and a speed-increase switching device 5.

The driving voltage switching device 2 has a function of, based on a change in a control signal input from an external upper-level controller (not illustrated), switching a driving voltage to be output between positive potential (+Vcc potential in the illustrated example) and negative potential (zero potential in the illustrated example). The control signal is a binary signal, indicating H level or L level. When the control signal is H level, the driving voltage switching device 2 outputs a positive-potential driving voltage. When the control signal is L level, the driving voltage switching device 2 outputs a negative-potential driving voltage.

The low-speed control device 3 has a function of applying the gate voltage (control voltage) to between the gate terminal, Gm (control terminal), and the source terminal, Sm, of the MOSFET (hereinafter referred to as main circuit MOSFET 100) in the main circuit such that the gate voltage is increase-decrease changeable at a low speed. For example, upon switching of the driving voltage by the driving voltage switching device 2, as described later, the low-speed control device 3 makes an increase-decrease change in the gate voltage at a low speed by limiting the current flowing into or out of the gate terminal Gm.

The speed-increase control device 4 has a function of executing a speed-increase control of increasing the speed of the increase-decrease change that the low-speed control device 3 made in the gate voltage applied to the main circuit MOSFET 100. In the illustrated example, the speed-increase control device 4 performs this speed-increase control by causing the low-speed control device 3 to: increase the current flowing into the gate terminal Gm of the main circuit MOSFET 100, thereby charging the main circuit MOSFET 100; or increase the current flowing out of the gate terminal Gm, thereby discharging the main circuit MOSFET 100. Content of the speed-increase control will be detailed later.

The speed-increase switching device 5 has a function of: switching between an execution and a non-execution (operating/not operating; functioning/not functioning) of the speed-increase control executed by the speed-increase control device 4; and switching the level of the speed-increase change caused by the speed-increase control. Referring to FIG. 1, the speed-increase switching device 5 includes a timing adjustment device 6, a conduction detection device 7, and a conduction switching device 8.

The timing adjustment device 6 has a function of switching between the execution and the non-execution of the speed-increase control executed by the speed-increase control device 4. The timing adjustment device 6 performs the switching at a switching timing at which a predetermined period of time has passed since the driving voltage switching device 2 made the switching between driving voltages.

The conduction detection device 7 has a function of detecting an increase-decrease change state of the main current conducted between the drain terminal Dm and the source terminal Sm (the pair of main terminals) of the main circuit MOSFET 100 (the increase-decrease change state is a state in which the main current is increasing or decreasing over time, instead of being constant).

The conduction switching device 8 has a function of, upon detection of the increase-decrease change state of the main current by the conduction detection device 7, making a switching to increase the speed-increase change in the speed-increase control executed by the speed-increase control device 4.

It is to be noted that the above-described function of the speed-increase switching device 5 to switch the speed-increase control will be detailed later.

Specific Circuit Configuration Example of Driving Circuit

Figure 2:
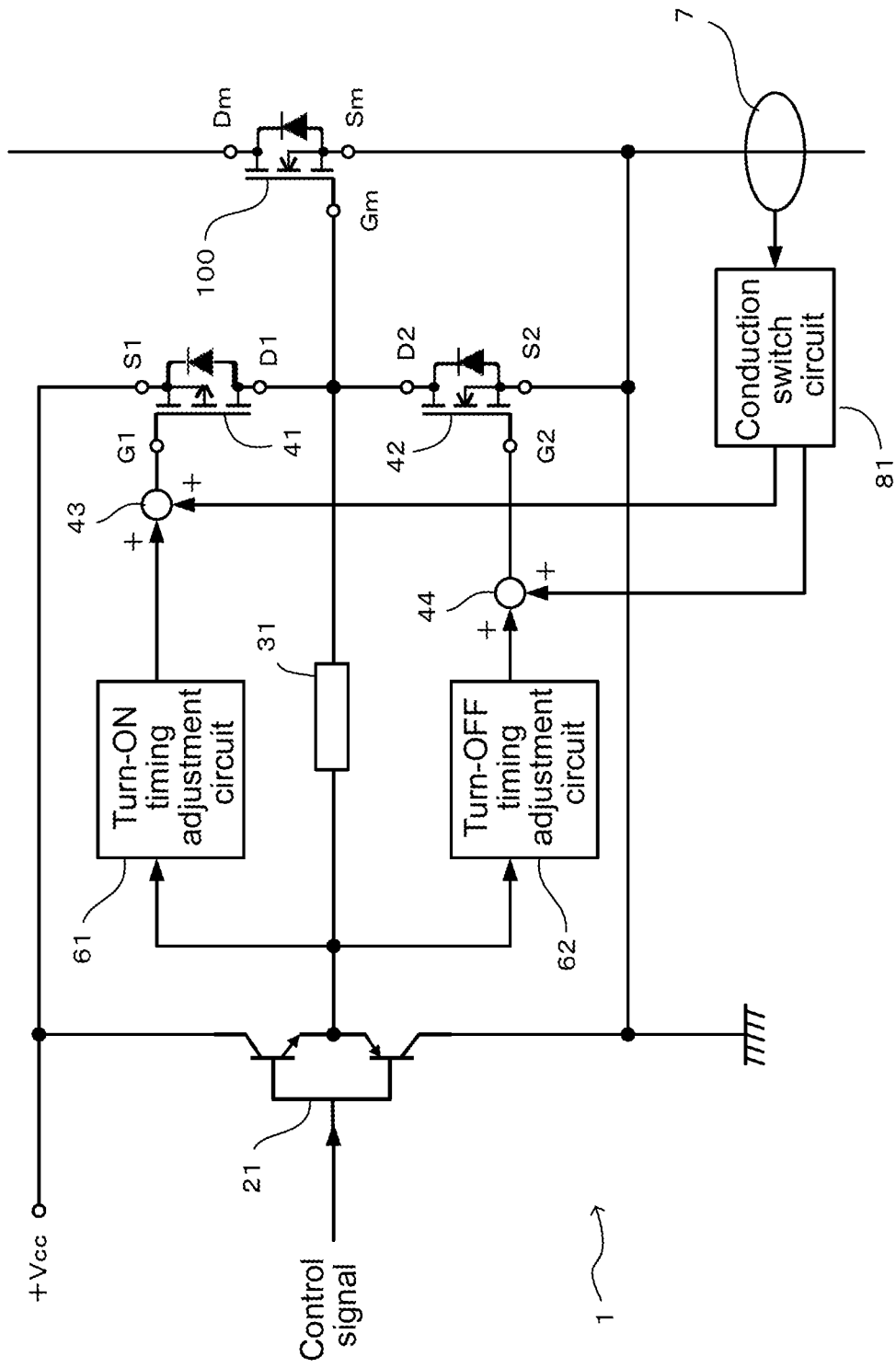
FIG. 2 is a circuit diagram illustrating a specific mounting example of the driving circuit according to the embodiment.

Next, FIG. 2 is a circuit diagram illustrating a specific mounting example of the driving circuit 1 according to this embodiment illustrated in FIG. 1. Referring to FIG. 2, the driving voltage switching device 2 is implemented by a "push-pull circuit 21". When the control signal is H level, the driving voltage switching device 2 outputs a +Vcc-potential driving voltage. When the control signal is L level, the driving voltage switching device 2 outputs a zero-potential driving voltage.

The low-speed control device 3 is implemented by a gate resistor 31 (control resistor). The gate resistor 31 has a fixed resistance value and is provided between and connected to the output of the push-pull circuit 21 and the gate terminal Gm of the main circuit MOSFET 100. The push-pull circuit 21 limits the current to be output, and inputs the current into the gate terminal Gm of the main circuit MOSFET 100.

The timing adjustment device 6 is implemented by, for example, a CR time constant timer circuit, not illustrated. In this embodiment, the timing adjustment device 6 includes two adjustment circuits, namely, a turn-ON timing adjustment circuit 61 and a turn-OFF timing adjustment circuit 62.

Upon switching of the driving voltage output from the push-pull circuit 21 from zero potential to +Vcc potential, the turn-ON timing adjustment circuit 61 outputs a voltage that exceeds a gate threshold voltage of a turn-ON speed-increase control MOSFET 41, described later. In this respect, a CR time constant is set such that the output voltage is caused to decrease continuously over time and becomes equal to or less than the above-described gate threshold voltage at the switching timing when a predetermined period of time has passed since a switching between driving voltages was made.

Upon switching of the driving voltage output from the push-pull circuit 21 from +Vcc potential to zero potential, the turn-OFF timing adjustment circuit 62 outputs a voltage that is lower than a gate threshold voltage of a turn-OFF speed-increase control MOSFET 42, described later. In this respect, a CR time constant is set such that the output voltage is caused to increase continuously over time and becomes equal to or more than the gate threshold voltage at the switching timing when the predetermined period of time has passed since a switching between driving voltages was made.

The conduction detection device 7 includes a circuit. When there occurs an increase-decrease change in the conduction amount of the main current in the main circuit (in the illustrated example, the circuit connected to the source terminal Sm) to which the main circuit MOSFET 100 is connected, the circuit of the conduction detection device 7 detects a voltage that corresponds to the amount of the change in the main current, which is caused to occur by an inherent inductance component of the main circuit and/or a magnetic coupling between wires. It is to be noted that a specific implementation configuration example of the conduction detection device 7 will be detailed later.

The conduction switching device 8 includes a conduction switch circuit 81. The conduction switch circuit 81 is implemented by, for example, a CR circuit, not illustrated. Upon detection of the voltage based on the above-described amount of change by the conduction detection device 7, the conduction switch circuit 81 outputs a predetermined voltage as a current detection signal.

In the illustrated example, the speed-increase control device 4 is implemented by MOSFETs, which are semiconductor switching elements. In this embodiment, the speed-increase control device 4 includes two MOSFETs, namely, the turn-ON speed-increase control MOSFET 41 and the turn-OFF speed-increase control MOSFET 42.

The turn-ON speed-increase control MOSFET 41 includes: a source terminal S1, which is connected to the +Vcc side of the MOSFET; a drain terminal D1, which is connected to the gate terminal Gm of the main circuit MOSFET 100; and a gate terminal G1, to which a voltage obtained by adding the output voltage of the turn-ON timing adjustment circuit 61 to the output voltage of the conduction switch circuit 81 is applied.

The turn-OFF speed-increase control MOSFET 42 includes: a source terminal S2, which is connected to the source terminal Sm of the main circuit MOSFET 100; a drain terminal D2, which is connected to the gate terminal Gm of the main circuit MOSFET 100; and a gate terminal G2, to which a voltage obtained by adding the output voltage of the turn-OFF timing adjustment circuit 62 to the output voltage of the conduction switch circuit 81 is applied.

It is to be noted that in the above description, adders 43 and 44 add the output voltages of the adjustment circuits 61 and 62 to the output voltage of the conduction switch circuit 81. The adders 43 and 44 each may be implemented by, for example, a CR circuit, not illustrated. It is also to be noted that in order to prevent an erroneous turn-ON, such as a self-turn-ON, from occurring, the circuit configuration between the push-pull circuit 21, the turn-OFF speed-increase control MOSFET 42, and the main circuit (that is, the source terminal Sm side of the main circuit MOSFET 100) may be reverse-biased such that when the control signal is L level, the driving voltage is a negative voltage of less than 0 (this circuit configuration is not illustrated).

Features of this Embodiment

As described above, semiconductor elements such as MOSFETs (in the illustrated example, the main circuit MOSFET 100) are used as switching elements to switch between making and breaking conduction of a large amount of current in main circuits. In such semiconductor element, a gate voltage (control voltage) is applied to between the gate terminal Gm and the source terminal Sm for a period of time. The level of the gate voltage applied and the period of time decide: a circulation state (in which a conduction is made or broken) of the main current between another source terminal Sm and the drain terminal Dm (that is, the main current is the chain current of the main circuit MOSFET 100); the conduction amount of the main current; and an inter-main-terminal voltage (which is the drain voltage of the main circuit MOSFET 100). When such semiconductor element is intended to be applied to a power converter such as an inverter, there is a standard to comply with; it is required to keep the increase-decrease change period of the inter-main-terminal voltage to equal to or longer than a predetermined period of time, which is specified for reasons such as avoidance of a surge occurring at a motor terminal.

However, during a switching between making and breaking of conduction, there occurs a switching loss, which is an instantaneous phenomenon calculated as the product of the inter-main-terminal voltage and the main current. As the period of time for switching between making and breaking of conduction becomes longer, the total amount of power consumed increases, which is equivalent to an accumulation of switching losses.

Under the circumstances, the driving circuit 1 according to this embodiment, which controls the gate voltage of the main circuit MOSFET 100, includes: the driving voltage switching device 2, which based on a change in the control signal, makes a switching between driving voltages and outputs a driving voltage, among the driving voltages, that has been selected in the switching; the low-speed control device 3, which makes an increase-decrease change in the gate voltage at a low speed; the speed-increase control device 4, which increases the speed of the increase-decrease change in the gate voltage made by the low-speed control device 3; and the speed-increase switching device 5, which switches between the execution and the non-execution of the speed-increase control executed by the speed-increase control device 4, and switches the level of the speed-increase change caused by the speed-increase control.

This configuration ensures that increase-decrease change sequences of the main current and the inter-main-terminal voltage after a change in the control signal can be set in the form of a combination of a low-speed mode and a speed-increase mode (which are a first speed-increase section and a second speed-increase section, respectively, as described later). In other words, a time-series increase-decrease change curve of each of the main current and the inter-main-terminal voltage can be designed to have various inclination combinations. This ensures that no matter which time-series control characteristics a driving-target semiconductor element has, the increase-decrease change sequences of the main current and the inter-main-terminal voltage can be designed to decrease the total amount of switching loss based on the control characteristic curve of the semiconductor element and the minimum increase-decrease change period of the inter-main-terminal voltage. The functions described in this embodiment will be detailed below in order.

Time-Series Control Characteristics of Main Circuit MOSFET and Switching Loss

Figure 3:
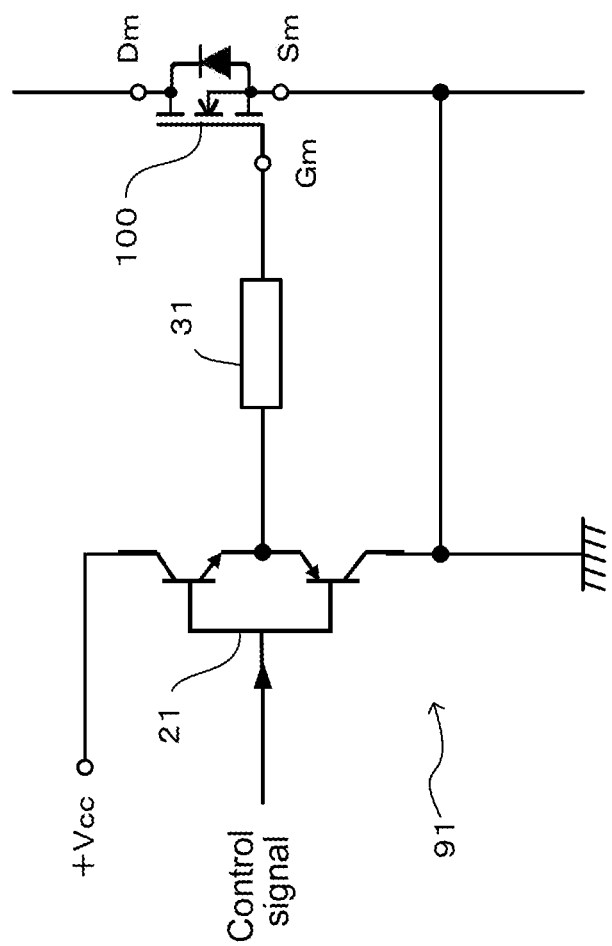
FIG. 3 is a circuit diagram of a driving circuit according to a comparative example.
Figure 4:
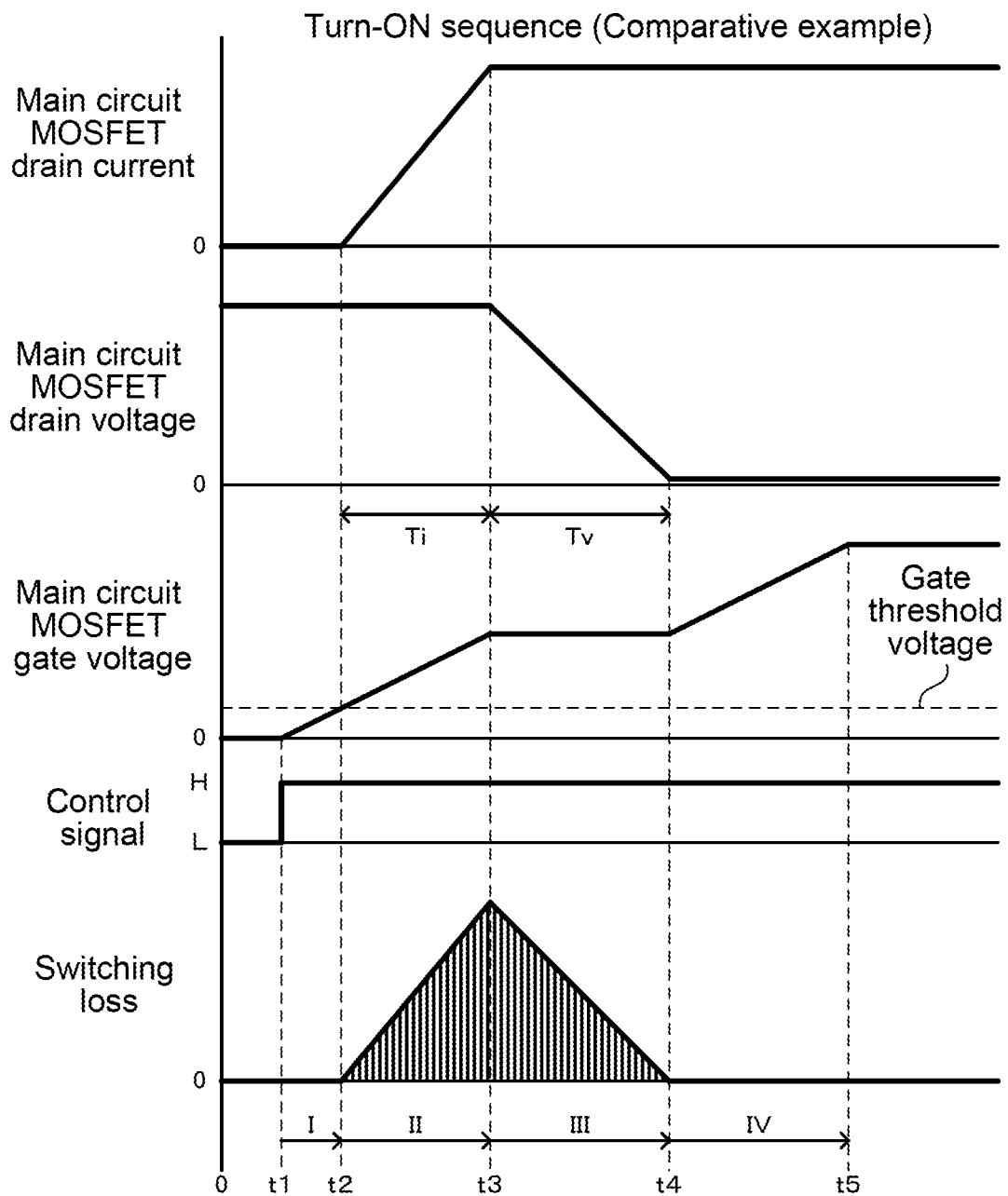
FIG. 4 is a time chart of a turn-ON sequence in the driving circuit according to the comparative example.
Figure 5:
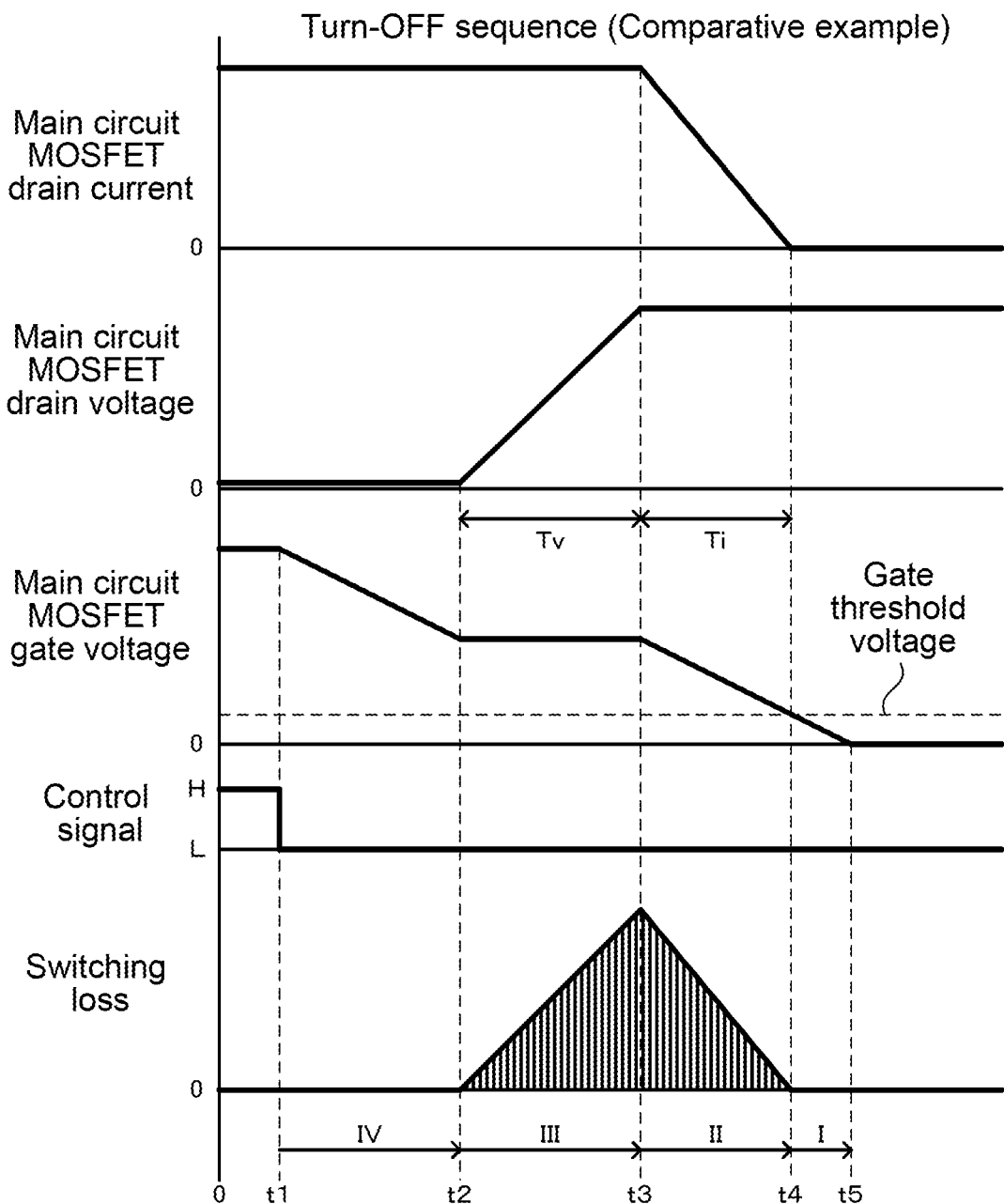
FIG. 5 is a time chart of a turn-OFF sequence in the driving circuit according to the comparative example.

For detailed description of time-series control characteristics of the main circuit MOSFET 100 and switching loss, a case where a driving circuit 91 according to the comparative example illustrated in FIG. 3 is applied will be described first. A comparison between the driving circuit 91 according to the comparative example illustrated in FIG. 3 and the driving circuit 1 according to the embodiment illustrated in FIG. 2 shows that the driving circuit 91 is different from the driving circuit 1 in that the driving circuit 91 does not include the timing adjustment circuits 61 and 62, the speed-increase control MOSFETs 41 and 42, the adders 43 and 44, the conduction detection device 7, and the conduction switch circuit 81. That is, the driving circuit 91 according to the comparative example has such a simple configuration that the +Vcc-potential driving voltage and the zero-potential driving voltage, which are switchably output from the push-pull circuit 21 of the driving voltage switching device 2 based on the control signal, are input into the gate terminal Gm of the main circuit MOSFET 100 so that the gate voltage is increase-decrease changed at a low speed by a current limitation performed at the gate resistor 31, which is the low-speed control device 3. FIG. 4 illustrates a sequence time chart of a turn-ON control of the main circuit MOSFET 100 using the driving circuit 91 according to the comparative example, and FIG. 5 illustrates a sequence time chart of a turn-OFF control of the main circuit MOSFET 100 using the driving circuit 91.

Figure 13:
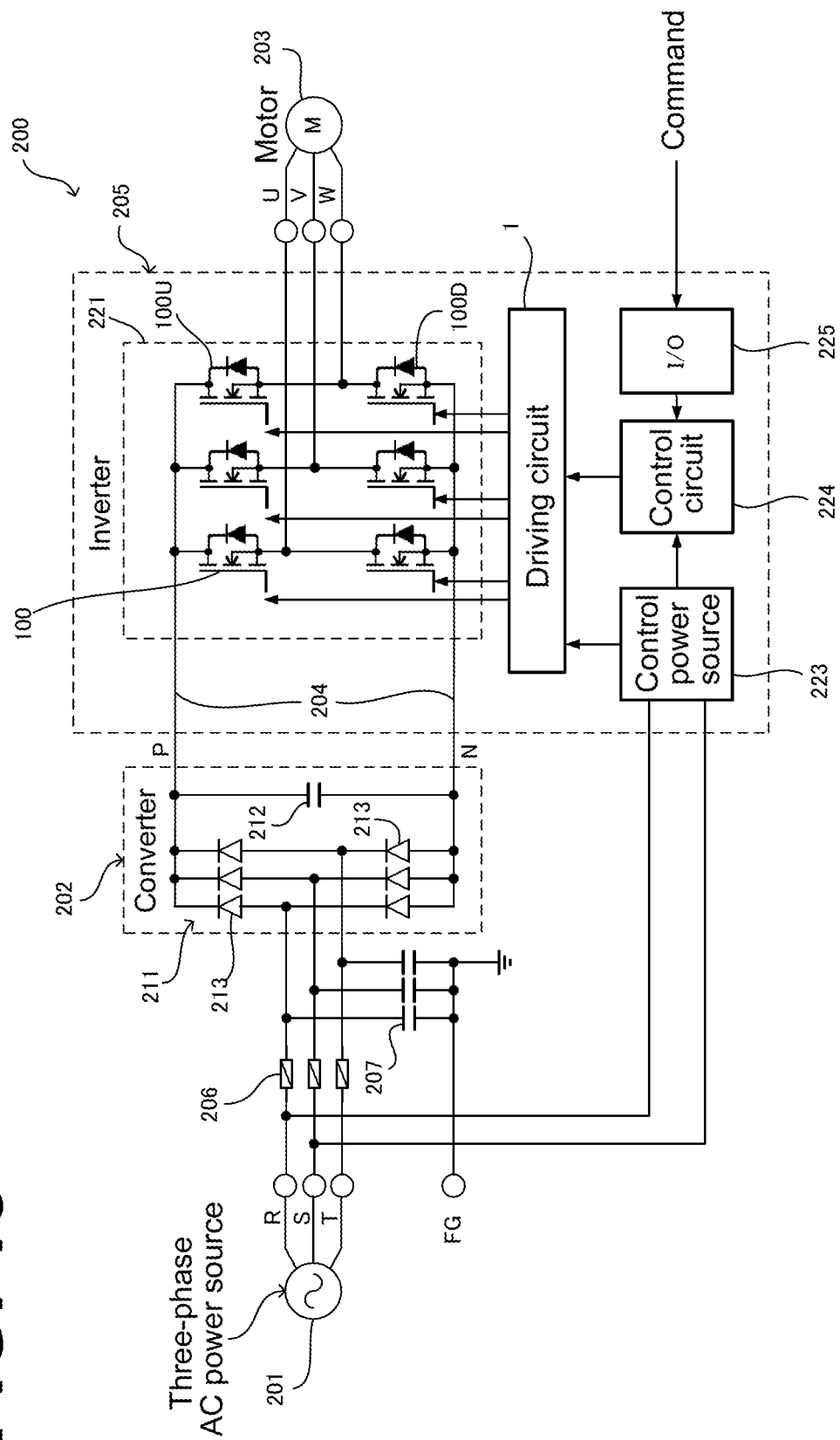
FIG. 13 is a schematic illustrating a circuit configuration of a motor control apparatus as a whole to which the driving circuit is applied.

In the turn-ON sequence illustrated in FIG. 4, an initial state before the start of this sequence is such that the drain current of the main circuit MOSFET 100 (equivalent to the main current of the main circuit) is 0, and that the drain voltage of the main circuit MOSFET 100 (equivalent to the inter-terminal voltage between the source terminal Sm and the drain terminal Dm in this case) is approximately the voltage (OFF voltage) between DC bus lines 204 (see FIG. 13, described later). Upon switching of the control signal from L level to H level (see t1 timing in the relevant drawing), the turn-ON sequence starts, increasing the gate voltage of the main circuit MOSFET 100, which was hitherto at zero potential (see step I in the relevant drawing).

When the gate voltage has exceeded the gate threshold voltage of the main circuit MOSFET 100 (see t2 timing in the relevant drawing), the drain current of the main circuit MOSFET 100 increases from 0 to load current, in accordance with the increase in the gate voltage (see step II in the relevant drawing). In this comparative example, the period of time spent in increasing the drain current at step II will be referred to as increase-decrease change period Ti of the drain current.

At and after the point of time at which step II ends (see t3 timing in the relevant drawing), the drain voltage decreases from OFF voltage to ON voltage of the MOSFET 100 (see step III in the relevant drawing). During step III, the gate voltage is kept approximately constant. The period of time spent in decreasing the drain voltage at step III will be referred to as increase-decrease change period Tv of the drain voltage.

At and after the point of time at which step III ends (see t4 timing in the relevant drawing), the gate voltage increases to +Vcc of the driving voltage (see step IV in the relevant drawing). Upon ending of step IV (see t5 timing in the relevant drawing), the turn-ON sequence ends, which is a sequence in which the main circuit MOSFET 100 shifts from the main-current non-conduction state to the main-current conduction state.

Thus, the semiconductor element of the main circuit MOSFET 100 has such a time-series control characteristic that in accordance with the increase in the gate voltage at all steps I to IV of the turn-ON sequence, the drain current increases from 0 to the load current, and then the drain voltage decreases from the OFF voltage to the ON voltage.

This time-series control characteristic of the main circuit MOSFET 100 appears in a backward time-series order in the turn-OFF sequence illustrated in FIG. 5. Specifically, step I will be assumed as a step of increase-decrease changing the gate voltage at equal to or less than the gate threshold voltage, step II will be assumed as a step of increase-decrease changing the chain current, step III will be assumed as a step of increase-decrease changing the drain voltage, and step IV will be assumed as a step of increase-decrease changing the gate voltage at or near its maximum value. Under this assumption, such a time-series control characteristic appears that the steps proceed in inverse order of: step IV→step III→step II→step I, after the control signal is switched from H level to L level and the turn-OFF sequence starts.

That is, the semiconductor element of the main circuit MOSFET 100 has such a time-series control characteristic that in accordance with the decrease in the gate voltage at all steps IV to I of the turn-OFF sequence, the drain voltage increases from the ON voltage to the OFF voltage first, and then the drain current decreases from the load current to 0.

Because of this time-series control characteristic of the MOSFET, there occurs one switching loss after another during a switching between making and breaking of conduction by increase-decrease changing either the drain current or the drain voltage. The switching loss is an instantaneous phenomenon calculated as the product of the inter-main-terminal voltage (drain voltage) and the main current (drain current). As a result, in each of the turn-ON sequence and the turn-OFF sequence as a whole, the switching loss appears as the total of switching losses accumulating in the increase-decrease change period Ti of the drain current and the increase-decrease change period Tv of the drain voltage (see the hatched part in the relevant drawings).

Also in the semiconductor element of the main circuit MOSFET 100, for example, as the current flowing into the gate terminal Gm in the turn-ON sequence increases or as the current flowing out of the gate terminal Gm in the turn-OFF sequence increases by decreasing the resistance value of the gate resistor 31, the rate of the increase-decrease change of the gate voltage at steps I to IV increases; that is, the inclination of the increase-decrease change curve increases (it is to be noted, however, that the gate voltage at step III is approximately constant). This is equivalent to increasing the speed of the over-time proceeding of each of steps I to IV, thereby increasing the speed of the increase-decrease change in each of the drain current, the drain voltage, and the gate voltage.

Under the circumstances, if the current flowing into or out of the gate terminal Gm is increased by setting the fixed resistance value of the gate resistor 31 at a low value, the period of time spent at each of steps I to IV is shortened; specifically, by shortening the period of switching time as a whole (that is, the period of time required for the turn-ON sequence or the turn-OFF sequence as a whole), the total amount of switching loss is decreased.

In the use of the semiconductor element of the main circuit MOSFET 100, however, there is a standard to comply with; it is required to keep the increase-decrease change period Tv of the inter-main-terminal voltage to equal to or longer than a predetermined period of time, which is specified for reasons such as avoidance of a surge occurring at a motor terminal. That is, there is a trade-off relationship between: reducing the total amount of switching loss by shortening the period of switching time; and keeping the main circuit sound.

In light of the above-described control characteristics of the main circuit MOSFET 100, the driving circuit 1 according to this embodiment has a function of performing a local speed-increase control of the gate voltage so as to realize a reduction in power loss while securing a sufficient period of switching time.

Figure 6:
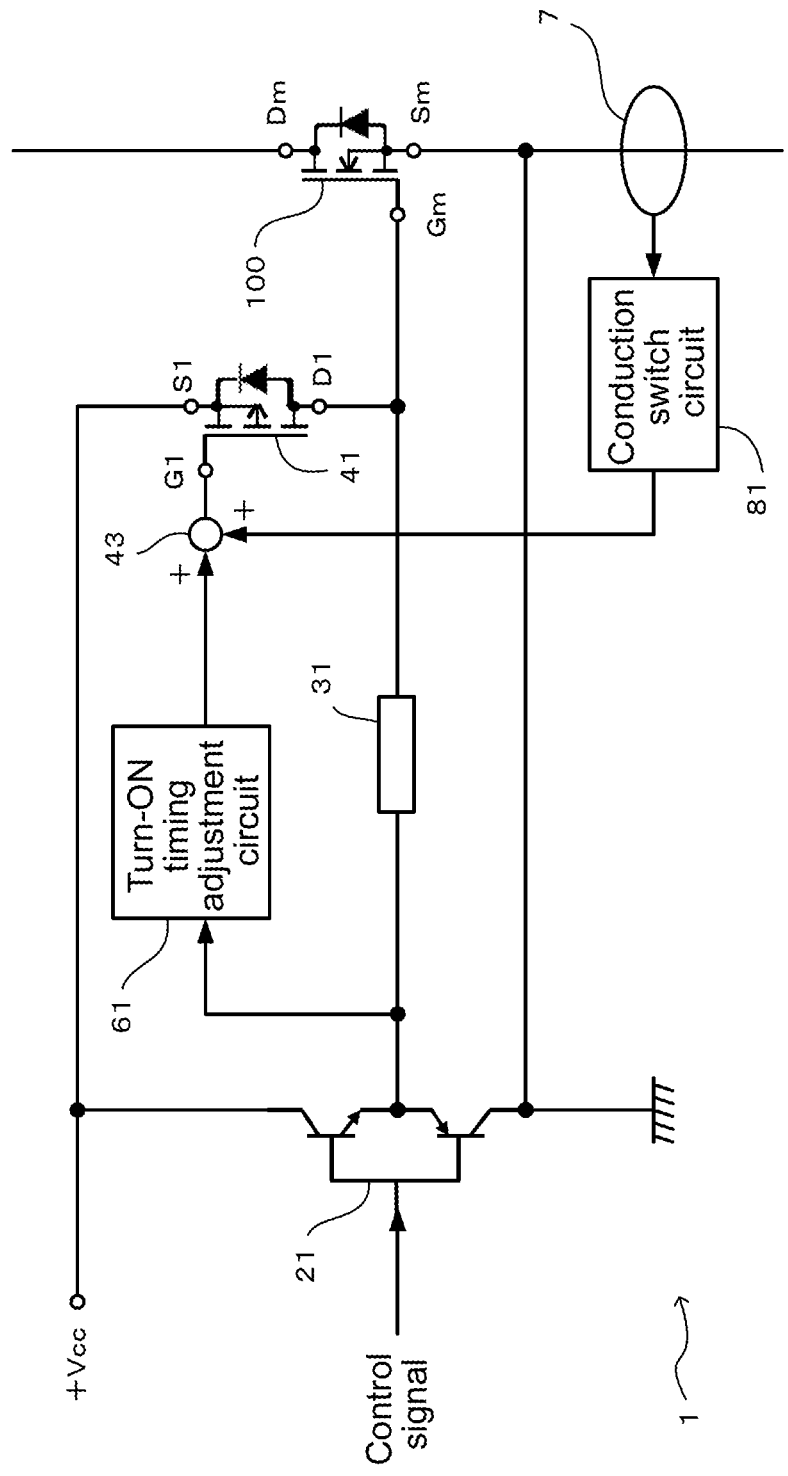
FIG. 6 is a partial circuit diagram of, among the parts of the driving circuit according to the embodiment, those parts that function in turn-ON control.
Figure 7:
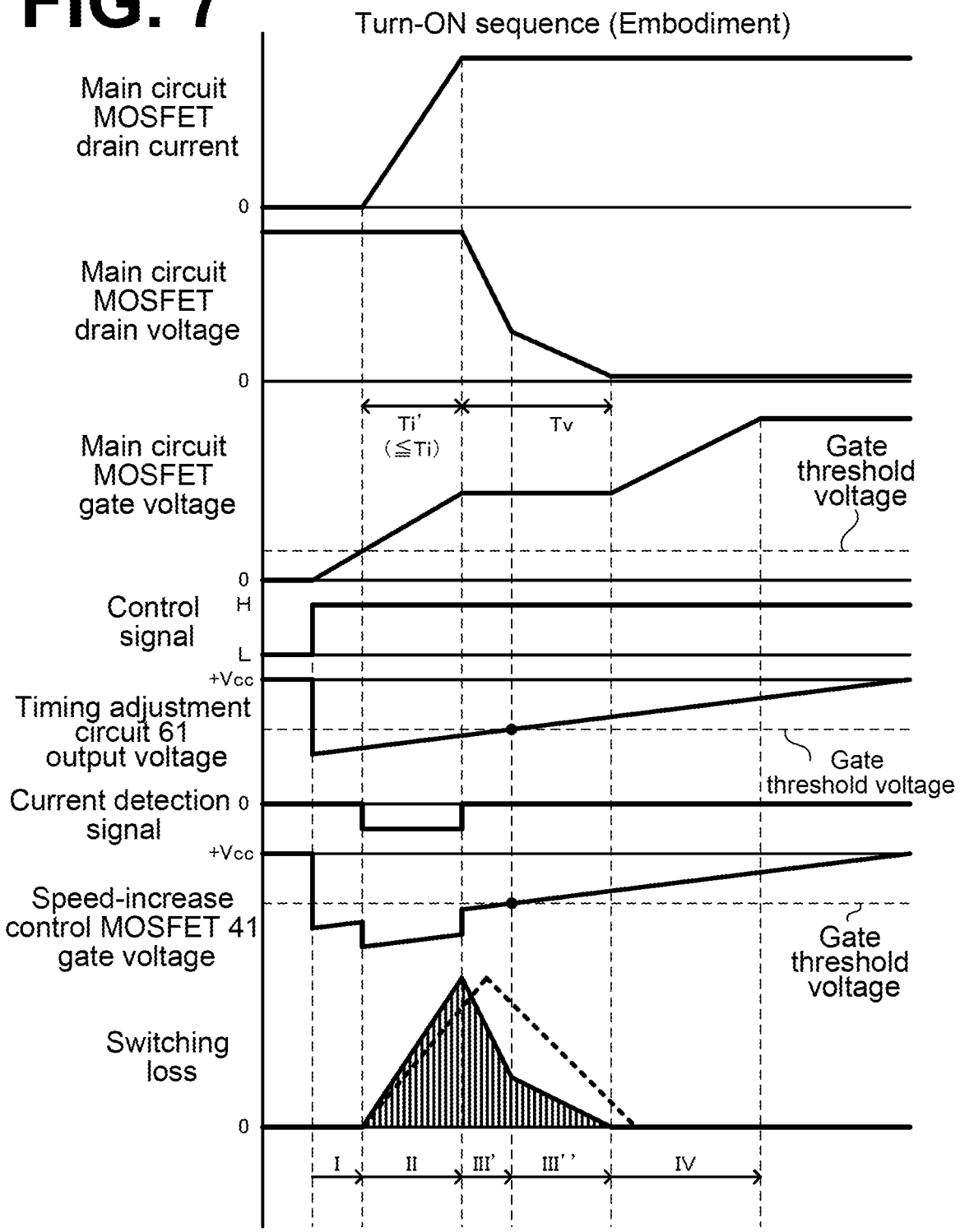
FIG. 7 is a time chart of a turn-ON sequence in the driving circuit according to the embodiment.

Speed-Increase Control Executed by Driving Circuit According to the Embodiment The speed-increase control function of the driving circuit 1 according to this embodiment will be described below. FIG. 6 is a partial circuit diagram illustrating those parts, among the driving circuit 1 according to this embodiment illustrated in FIG. 2, that function in the turn-ON control. FIG. 7 is a time chart of the turn-ON sequence of the turn-ON control.

Referring to FIGS. 6 and 7, based on the driving voltage switched to +Vcc potential upon rising of the control signal to H level, the turn-ON timing adjustment circuit 61 outputs a voltage that exceeds the gate threshold voltage of the turn-ON speed-increase control MOSFET 41, as described above. Then, the turn-ON timing adjustment circuit 61 continuously decreases the output voltage over time, and at the switching timing during step III (during the increase-decrease change period Tv of the drain voltage), changes the output voltage to equal to or less than the gate threshold voltage. It is to be noted that the turn-ON speed-increase control MOSFET 41 is a P-channel MOSFET, and thus the output voltage of the turn-ON timing adjustment circuit 61 is indicated on a +Vcc-potential basis.

While the conduction detection device 7 is detecting an increase state of the main current in the main circuit, that is, during step II, which is when the drain current increases, the conduction switch circuit 81 outputs, as a current detection signal, a predetermined voltage that is based on the amount of current change (the above-described reason, the current detection signal is indicated as negative potential).

In this respect, when the gate voltage of each of the semiconductor switching elements of the speed-increase control MOSFETs 41 and 42 is lower than a gate threshold voltage unique to the element, the state between the source terminal S1 and the drain terminal D1 and the state between the source terminal S2 the drain terminal D2 are in non-conduction state. When the gate voltage is higher than the gate threshold voltage, the conduction amount between the source terminal S1 and the drain terminal D1 and the conduction amount between the source terminal S2 and the drain terminal D2 increase by an amount equivalent to the amount by which the gate voltage is higher than the gate threshold voltage. Thus, each of the semiconductor switching elements of the speed-increase control MOSFETs 41 and 42 has control characteristics represented by a switching function and a function of adjusting the amount of conduction. In the speed-increase control in the case of the turn-ON control, the turn-ON speed-increase control MOSFET 41 operates to determine whether to increase the current flowing from the gate resistor 31 into the gate terminal Gm of the main circuit MOSFET 100.

By applying the gate voltage that is increase-decrease changeable in the above-described manner to the turn-ON speed-increase control MOSFET 41 having the above-described control characteristics, speed-increase controls corresponding to respective steps I to IV in the turn-ON sequence are performed.

Specifically, at step I, the turn-ON speed-increase control MOSFET 41 is caused to execute a speed-increase control using such an output voltage of the turn-ON timing adjustment circuit 61 that is slightly in excess of the gate threshold voltage. That is, the current flowing into the gate terminal Gm of the main circuit MOSFET 100 is set at a current slightly larger than the current flowing from the gate resistor 31 alone. With this configuration, in the speed-increase control performed at step I, the increase rate of the gate voltage of the main circuit MOSFET 100 is slightly higher than in the above-described comparative example, resulting in a shortened period of time spent at step I. This speed-increase control is a comparatively low-speed speed-increase control, and a section in which this speed-increase control is performed will be hereinafter referred to as first speed-increase section.

At step II, the turn-ON speed-increase control MOSFET 41 is caused to execute a speed-increase control using the sum of: such an output voltage of the turn-ON timing adjustment circuit 61 that is in excess of the gate threshold voltage; a current detection signal output at a predetermined constant positive voltage. That is, the current flowing into the gate terminal Gm of the main circuit MOSFET 100 is set at a current that is larger than the current set at step I. With this configuration, in the speed-increase control performed at step II, the increase rate of the gate voltage of the main circuit MOSFET 100 is sufficiently larger than the rate in the comparative example. As a result, the increase change period, Ti' (<Ti), of the drain current, which is the period of time spent at step II, is shortened. This speed-increase control is a comparatively high-speed speed-increase control, and a section in which this speed-increase control is performed will be hereinafter referred to as second speed-increase section.

Step III is divided into: a first half period in which the output voltage of the turn-ON timing adjustment circuit 61 is in excess of the gate threshold voltage (see step III' illustrated in the relevant drawing); and a second half period in which the output voltage is less than the gate threshold voltage (see step III" illustrated in the relevant drawing).

Step III' is a first speed-increase section, in which a comparatively low-speed speed-increase control is performed, similarly to step I. In the speed-increase control performed at step III', the decrease rate of the drain voltage of the main circuit MOSFET 100 is larger than the rate in the comparative example (it is to be noted, however, that the gate voltage is approximately constant).

At step III", the output voltage of the turn-ON timing adjustment circuit 61 is less than the gate threshold voltage, and no current detection signal from the conduction switch circuit 81 is added. Therefore, step III" is in a state in which no speed-increase control is performed by the turn-ON speed-increase control MOSFET 41. Under the circumstances, at step III", the current applied to the gate terminal Gm of the main circuit MOSFET 100 is the current through the gate resistor 31 alone, similarly to the comparative example. As a result, step III" is performed for a period of time longer than the period of time spent at step III' which is the first speed-increase section.

In this respect, while the period of time spent at step III' is shorter than the period of time in the comparative example, the period of time spent at step III" is longer than the period of time spent at step III'. As a result, the decrease change period, Tv, of the drain voltage at step III' and step III" combined meets the shortest period of time standard. This eliminates or minimizes an increase in an average decrease change ratio of dV/dt in the decrease change period Tv of the chain voltage as a whole. In order to set the switching timing at which to switch step III' to step III" while ensuring that the decrease change period Tv of the drain voltage is equal to or longer than the shortest period of time standard, it is possible to adjust the combination of the CR time constant of the turn-ON timing adjustment circuit 61 and the resistance value of the gate resistor 31 in any manner deemed convenient.

Step IV is in a state in which no speed-increase control is performed by the turn-ON speed-increase control MOSFET 41, similarly to step III". In this state, the gate voltage of the main circuit MOSFET 100 increases over a period of time and with an increase rate respectively equivalent to the period of time and the increase rate at step IV in the comparative example.

In the turn-ON sequence performed by the driving circuit 1 according to this embodiment with the above-described configuration, the total amount of switching loss decreases as compared with the comparative example. Specifically, the total amount of switching loss decreased is attributed to the shortening of the increase change period Ti' (<Ti) of the drain current at step II. Also, the total amount of switching loss decreased is attributed to a depression found in the decrease portion of the increase-decrease change curve of the drain voltage at step III' and step III". The total amount of switching loss (the hatched area in FIG. 7) decreased by a combination of these factors is advantageously smaller than the total amount of switching loss in the comparative example (see the dotted line region in FIG. 7).

Figure 8:
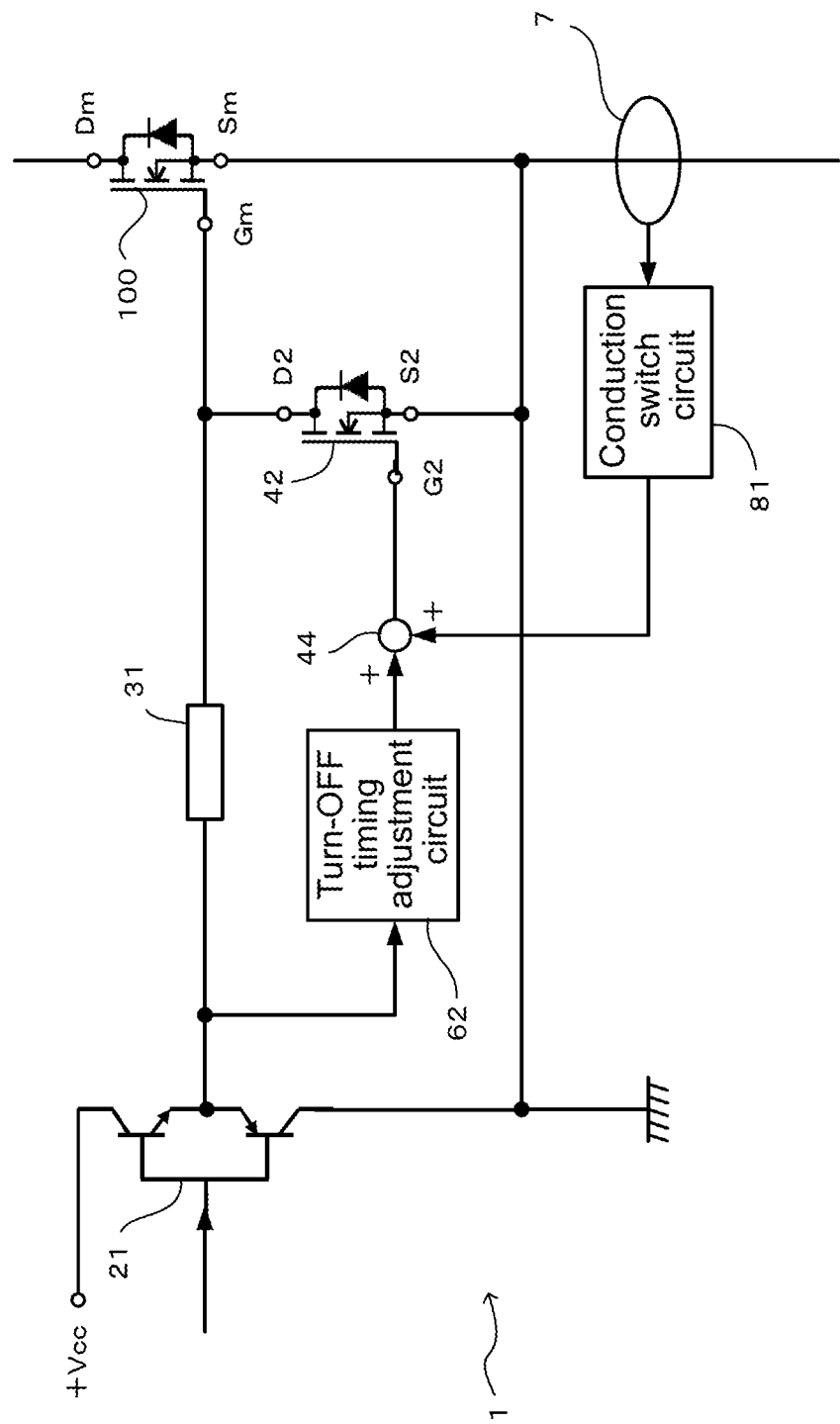
FIG. 8 is a partial circuit diagram of, among the parts of the driving circuit according to the embodiment, those parts that function in turn-OFF control.
Figure 9:
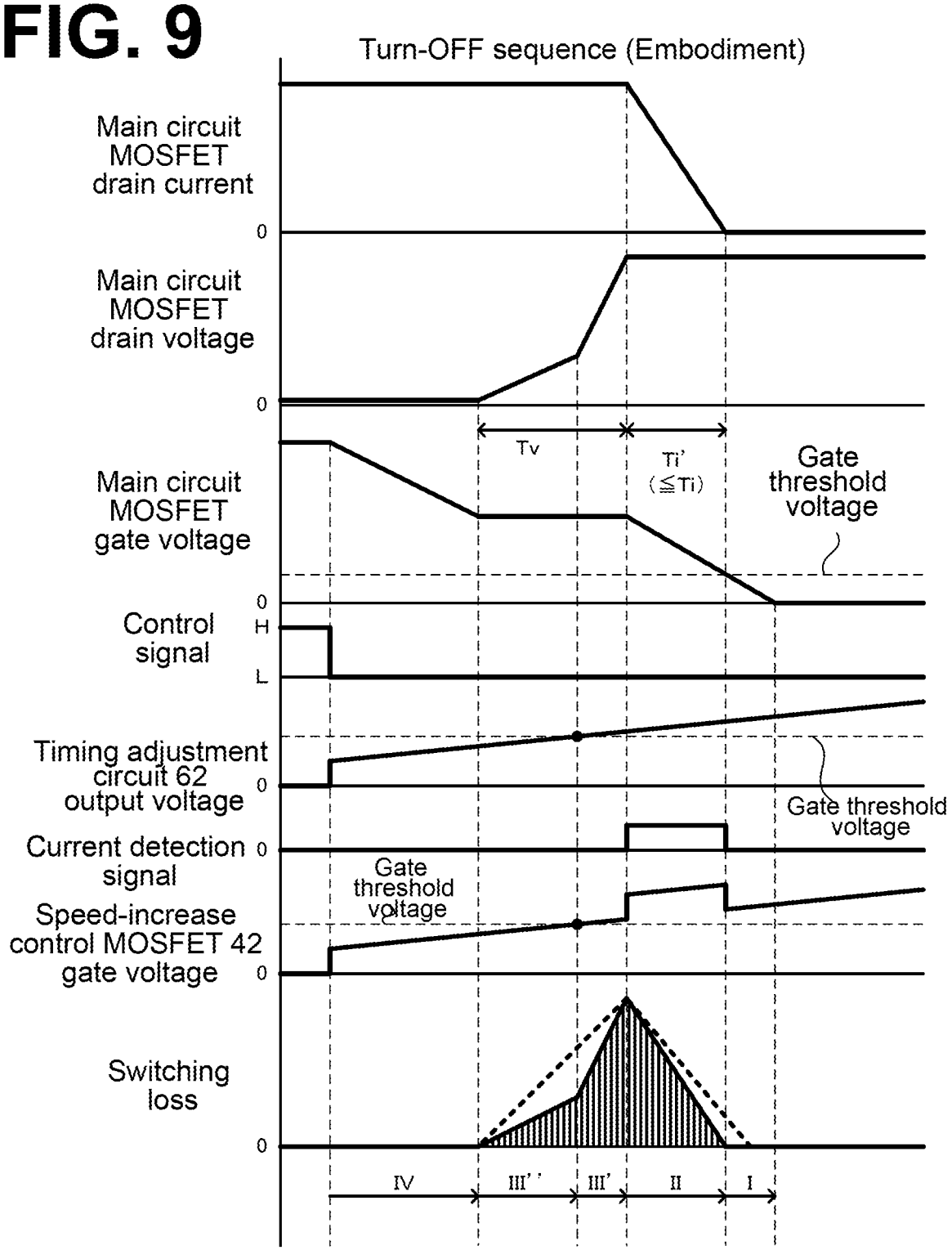
FIG. 9 is a time chart of a turn-OFF sequence in the driving circuit according to the embodiment.

Thus, in the speed-increase control according to this embodiment, the increase-decrease change period Tv of the drain voltage is maintained, and the total amount of switching loss is decreased in a sequence as a whole. These effects are also obtained in the turn-OFF sequence. FIG. 8 is a partial circuit diagram illustrating those parts, among the driving circuit 1 according to this embodiment illustrated in FIG. 2, that function in the turn-OFF control. FIG. 9 is a time chart of the turn-OFF sequence of the turn-OFF control. In the speed-increase control in the case of the turn-OFF control, the turn-OFF speed-increase control MOSFET 42 operates to determine the extent to which the gate terminal Gm of the main circuit MOSFET 100 is to be discharged.

In the time chart illustrated in FIG. 9, the steps proceed in inverse order of step IV→step III"→step III'→step II→step I, after the control signal is switched from H level to L level and the turn-OFF sequence starts. At step IV and step III", no speed-increase control is performed; step III' is a first speed-increase section, in which a comparatively low-speed speed-increase control is performed; step II is a second speed-increase section, in which a comparatively high-speed speed-increase control is performed; and step I is a first speed-increase section, in which a comparatively low-speed speed-increase control is performed. This ensures that the increase change period, Tv, of the drain voltage at step III" and step III' combined meets the shortest period of time standard, and that the total amount of switching loss at step III", step III', and step II combined is advantageously decreased as compared with the comparative example.

Control Flow

Figure 10:
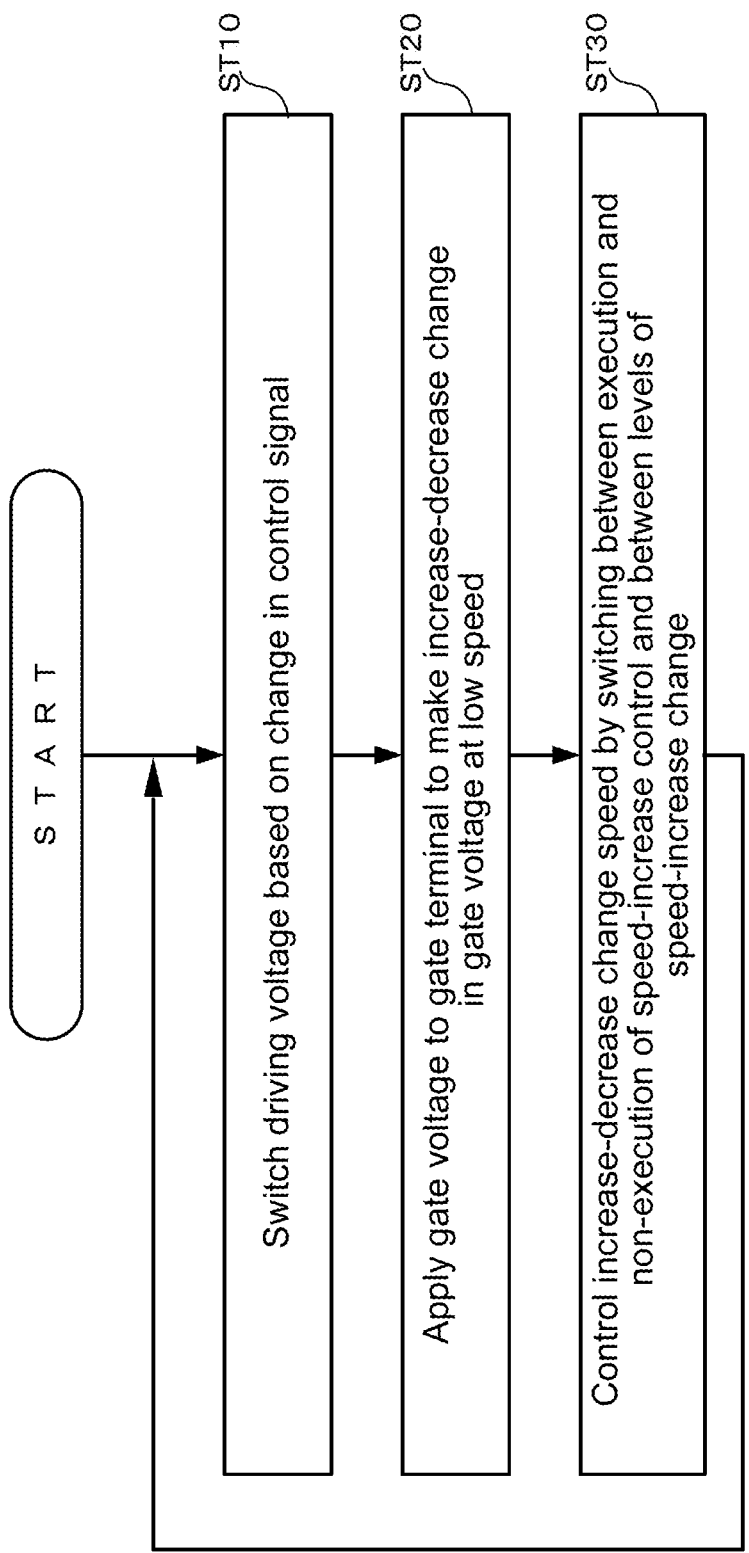
FIG. 10 is a flowchart of the control executed by the driving circuit according to the embodiment.

FIG. 10 illustrates a flow of control executed by the driving circuit 1 according to this embodiment. The flowchart illustrated in FIG. 10 shows a processing procedure for the method for driving the main circuit MOSFET 100 performed by the driving circuit 1 illustrated in FIG. 1 under the assumption that the elements of the driving circuit 1 perform their functions successively.

First, at step ST10, the driving voltage switching device 2 switches the driving voltage based on a change in the control signal, and outputs the switched driving voltage.

Next, the procedure proceeds to step ST20, where the low-speed control device 3 applies the gate voltage to the gate terminal Gm to make an increase-decrease change in the gate voltage of the main circuit MOSFET 100 at a low speed.

Next, the procedure proceeds to step ST30, where the speed-increase switching device 5 switches between an execution and a non-execution of speed-increase control executed by the speed-increase control device 4, and switches the level of a speed-increase change caused by the speed-increase control. In this manner, the speed-increase control device 4 controls the speed of the increase-decrease change in the gate voltage made by the low-speed control device 3. Then, the procedure returns to step ST10 and starts from the beginning.

Effects of the Embodiment

As has been described hereinbefore, the driving circuit 1 according to this embodiment for a semiconductor element includes: the driving voltage switching device 2, which based on a change in the control signal, makes a switching between driving voltages and outputs a driving voltage, among the driving voltages, that has been selected in the switching; the low-speed control device 3, which makes an increase-decrease change in the gate voltage of the main circuit MOSFET 100 at a low speed, and applies the gate voltage to the gate terminal Gm; the speed-increase control device 4, which executes a speed-increase control of increasing the speed of the increase-decrease change in the gate voltage made by the low-speed control device 3; and the speed-increase switching device 5, which switches between an execution and a non-execution of the speed-increase control executed by the speed-increase control device 4, and switches the level of a speed-increase change caused by the speed-increase control.

This configuration ensures that increase-decrease change sequences of the drain current (main current) and the drain voltage (inter-main-terminal voltage) of the main circuit MOSFET 100 after a change in the control signal can be set in the form of a combination of a low-speed mode and a speed-increase mode (the first speed-increase section and the second speed-increase section). In other words, a time-series increase-decrease change curve of each of the drain current and the drain voltage can be designed to have various inclination combinations. This configuration ensures that no matter which time-series control characteristics a driving-target semiconductor element of the main circuit has, the increase-decrease change sequences of the drain current and the drain voltage can be designed to decrease the total amount of switching loss based on the control characteristic curve of the semiconductor element and the minimum increase-decrease change period Tv of the drain voltage. This configuration, as a result, realizes a reduction in power loss while securing a sufficient period of switching time. It is to be noted that while the driving target of the driving circuit 1 is a semiconductor element of a main circuit, the driving target will not be limited to a MOSFET but may be a combination of an insulation gate bipolar transistor (IGBT) and an anti-parallel diode.

In particular, in this embodiment, the speed-increase switching device 5 includes the timing adjustment device 6. At a switching timing at which a predetermined period of time has passed since the driving voltage switching device 2 made the switching between driving voltages, the timing adjustment device 6 switches between the execution and the non-execution of the speed-increase control executed by the speed-increase control device 4. This configuration ensures that no matter which switching sequence the increase-decrease change sequence is (a turn-ON sequence or a turn-OFF sequence in the main circuit MOSFET 100), the increase-decrease change sequence can be designed in any manner deemed desirable such that the inclination of the increase-decrease change curves of the drain current and the drain voltage can be changed at an intended timing after a predetermined period of time has passed since a switching between driving voltages was made.

In particular, in this embodiment, the switching timing is set as a timing during the increase-decrease change period Tv of the drain voltage in the main circuit MOSFET 100. This configuration ensures that no matter which switching sequence the increase-decrease change sequence is (a turn-ON sequence or a turn-OFF sequence in the main circuit MOSFET 100), the inclination of the increase-decrease change curve can be changed during the increase-decrease change period Tv of the drain voltage, and the increase-decrease change sequence of the drain voltage can be designed in any manner deemed desirable such that the total amount of switching loss is decreased while a sufficient period of switching time is secured.

In particular, in this embodiment, when the main circuit MOSFET 100 is turned ON, the speed-increase switching device 5 switches, at the switching timing, the speed-increase control executed by the speed-increase control device 4 from the execution to the non-execution. This configuration ensures that in the turn-ON switching sequence, the inclination of the decrease change curve in the decrease change period Tv of the drain voltage can be changed from steep inclination (low speed-increase mode: the second speed-increase section) to moderate inclination (low-speed mode), and the increase-decrease change sequence of the drain voltage can be designed such that the total amount of switching loss is decreased while a sufficient period of switching time is secured.

In particular, in this embodiment, when the main circuit MOSFET 100 is turned OFF, the speed-increase switching device 5 switches, at the switching timing, the speed-increase control executed by the speed-increase control device 4 from the non-execution to the execution. This configuration ensures that in the turn-OFF switching sequence, the inclination of the increase change curve in the increase change period Tv of the drain voltage can be changed from moderate inclination (low-speed mode) to steep inclination (low speed-increase mode: the second speed-increase section), and the increase-decrease change sequence of the drain voltage can be designed such that the total amount of switching loss is decreased while a sufficient period of switching time is secured.

In particular, in this embodiment, the speed-increase switching device 5 includes: the conduction detection device 7, which detects an increase-decrease change state of the drain current (an increasing or decreasing state, instead of a constant state); and the conduction switching device 8, which makes a switching, when the conduction detection device 7 has detected the increase-decrease change state of the drain current, to increase the speed-increase change (the second speed-increase section) in the speed-increase control executed by the speed-increase control device 4. This configuration ensures that the gate voltage can be increase-decrease changed in a speed-increase mode (second accelerated section) in which a still larger speed-increase change is made in the increase-decrease change period Ti' of the drain current, and the increase-decrease change sequence of the drain current can be designed such that the total amount of switching loss is decreased.

In particular, in this embodiment, the low-speed control device 3 is implemented by the gate resistor 31. The gate resistor 31 limits the current through the gate terminal Gm of the main circuit MOSFET 100 to make a speed-increase change smaller than the speed-increase change smaller in the speed-increase control executed by the speed-increase control device 4. This configuration ensures that the low-speed control device 3 is implemented cheaply and functionally.

In particular, in this embodiment, the speed-increase control device 4 is implemented by a semiconductor switching element (MOSFET in the above-described embodiment) that controls: a switching between an application and a non-application of a current to the gate terminal Gm of the main circuit MOSFET 100; and the amount of the current. This ensures that the speed-increase control device 4 is implemented functionally. It is to be noted that the semiconductor switching element used as the speed-increase control device 4 will not be limited to the above-described MOSFET but may be a bipolar transistor.

Implementation Configuration Example of Conduction Detection Device

As described in the above embodiment, the conduction detection device 7 may be implemented by a circuit. When there occurs an increase-decrease change in the conduction amount of the main current through the main circuit to which the main circuit MOSFET 100 is connected, the circuit of the conduction detection device 7 detects a voltage that is based on the amount of the change occurring in the main current, which is caused to occur by an inherent inductance component of the main circuit. It is possible, however, that an amount of inherent inductance necessary for detecting the increase-decrease change state of the main current cannot be obtained in the circuit wiring of the module package of the main circuit MOSFET 100. In this case, it is possible to provide the conduction detection device 7 outside the module package of the main circuit MOSFET 100 such that the conduction detection device 7 is dedicated to a main current conduction wiring corresponding to the main circuit. The following description is regarding an implementation configuration example in which the conduction detection device 7 is provided outside the module package of the main circuit MOSFET 100.

Conduction Detection Device Implemented by Search Coil

FIGS. 11A and 11B illustrates an example configuration in which the conduction detection device 7 is implemented by a "search coil". FIG. 11A is a plan view of a circuit substrate including the search coil, and FIG. 11B is a side view of the circuit substrate and of a main circuit MOSFET module package mounted on the circuit substrate. Referring to FIG. 11, a main circuit MOSFET module package 101 includes package terminals 102 (three package terminals in the illustrated example). The package terminals 102 are connected to the main circuit in the main circuit MOSFET module package 101, and are fixed to the main circuit MOSFET module package 101 such that the package terminals 102 penetrate a circuit substrate 103 and are orthogonal to the circuit substrate 103. With this configuration, the main current passes through the circuit substrate 103 and flows into a wire, not illustrated. A pattern wiring 104, which serves as a search coil, is wired on a surface of the circuit substrate 103 and surrounds the package terminals 102. Specifically, the pattern wiring 104 surrounds the axis of the conduction direction of the main current (which is the axial direction of each package terminal 102, which has a cylindrical shape). As illustrated in the drawing, the pattern wiring 104, which is a search coil, is wired on the surface of the circuit substrate 103 opposite to the main circuit MOSFET module package 101. Otherwise, the pattern wiring 104 may be wired on the surface of the circuit substrate 103 facing the main circuit MOSFET module package 101 (this configuration is not illustrated). Thus, the conduction detection device 7 is implemented by a search coil. This configuration ensures that a stable function of detecting the increase-decrease change state of the main current is implemented at a lower price, regardless of the wiring layout in the main circuit MOSFET module package 101.

Conduction Detection Device Implemented by Transformer

FIGS. 12A and 12B illustrate an example configuration in which the conduction detection device 7 is implemented by a transformer. FIG. 12A is a plan view of a circuit substrate including the transformer (a cross-sectional view taken along arrow XIIa-XIIa illustrated in FIG. 12B), and FIG. 12B is a side cross-sectional view of the circuit substrate (a cross-sectional view taken along arrow XIIb-XIIb illustrated in FIG. 12A). Referring to FIG. 12, a main circuit pattern wiring 105, through which the main current is conducted, is wired on the circuit substrate 103. A ring-shaped magnetic core 106 surrounds the axis of the conduction direction of the main current and penetrates the circuit substrate 103. A detection pattern wiring 107 is wired on the surface of the circuit substrate 103 and surrounds the axis of the magnetization direction of the magnetic core 106 (that is, the circumferential direction of the ring-shaped magnetic core 106). A combination of the main circuit pattern wiring 105, the magnetic core 106, and the detection pattern wiring 107 serves as a transformer. As illustrated in the drawing, the detection pattern wiring 107 is wired on the surface of the circuit substrate 103 facing the main circuit pattern wiring 105. Otherwise, the detection pattern wiring 107 may be wired on the surface of the circuit substrate 103 opposite to the main circuit pattern wiring 105 (this configuration is not illustrated). Thus, the conduction detection device 7 is implemented by a transformer. This configuration as well ensures that a stable function of detecting the increase-decrease change state of the main current is implemented at a lower price, regardless of the wiring layout in the main circuit MOSFET module package 101.

Example Application of Driving Circuit

An example application of the driving circuit 1 according to the embodiment is a motor control apparatus that PWM-converts DC power into AC power of a predetermined frequency and feeds the AC power, as driving power, to a motor (rotary type or linear motion type). An example configuration of this motor control apparatus will be described below.

By referring to FIG. 13, a circuit configuration of a motor control apparatus according to this embodiment as a whole will be described. As illustrated in FIG. 13, the motor control apparatus 200 includes: a converter 202, which is connected to a three-phase AC power source 201; and an inverter 205, which is connected to a motor 203 and also connected to the converter 202 via the DC bus lines 204.

The converter 202 includes a rectifier 211 and a smoothing capacitor 212. The rectifier 211 is a diode bridge made up of six diodes 213. With this configuration, the rectifier 211 full-wave rectifies AC power from the three-phase AC power source 201 and outputs the resulting DC power to the DC bus lines 204. The smoothing capacitor 212 is extends between and is connected to the DC bus lines 204, and smoothens the DC power obtained by the full-wave rectification performed at the rectifier 211. With this configuration, the converter 202 rectifies and smoothens AC power supplied from the three-phase AC power source 201, thereby converting the AC power into DC power, and outputs the DC power to the DC bus lines 204, which are a pair of a positive electrode P line and a negative electrode N line.

The inverter 205 includes a bridge circuit 221, the driving circuit 1 according to the embodiment, a control power source 223, a control circuit 224, and an I/O 225.

The bridge circuit 221 is a device in which six arm switching elements 100, each of which is implemented by the semiconductor element of the main circuit MOSFET 100, are bridge-connected to each other. Specifically, a pair of the main circuit MOSFETs 100 are connected in series to each other, and three such pairs are connected in parallel to the DC bus lines 204. Among the main circuit MOSFETs 100, those main circuit MOSFETs 100 connected to the positive electrode side (P line side) DC bus line 204 will be referred to as upper arm switching elements 100U, and those main circuit MOSFETs 100 connected to the negative electrode side (N line side) will be referred to as lower arm switching elements 100D. The intermediate points of the three pairs of the upper arm switching elements 100U and the lower arm switching elements 100D correspond to different phases and are connected to the motor 203. The gate voltage (control voltage) of each arm switching element 100 is controlled by the driving circuit 1, and each arm switching element 100 is thus switched between conduction state (ON state) and non-conduction state (OFF state) (that is, between turn-ON and turn-OFF).

Based on a control signal input from a control circuit 24, described later, the driving circuit 1 controls the gate voltage (control voltage) of each arm switching element 100 of the bridge circuit 221, thereby switching each arm switching element 100 between ON state and OFF state (that is, between turn-ON and turn-OFF). It is to be noted that the driving circuit 1 is dedicated to one of the six arm switching elements 100 (main circuit MOSFETs 100) of the bridge circuit 221, that is, one driving circuit 1 is connected to one gate terminal Gm and one source terminal Sm. In FIG. 13, however, a single driving circuit 1 is illustrated, to avoid complicated illustration.

The control circuit 224 (control device) is made up of a CPU and related devices for executing power control software, and receives a motor control command input from an upper-level control apparatus, not illustrated, through the I/O 225 and/or a signal input circuit, not illustrated. Based on the motor control command, the control circuit 224 outputs a control signal to each driving circuit 1 so that a desired amount of power is supplied to the motor 203. The control signal is output as a result of PWM control that is based on the motor control command, and is used to control the driving circuit 1 to output the DC power between the DC bus lines 204 to the phases of the three-phase AC motor 203 from the intermediate connection positions of the pairs of the arm switching elements 100 of the bridge circuit 221.

The control power source 223 is connected to, for example, two phases of the three-phase AC power source 201, and supplies power to the elements provided in the inverter 205.

With the configuration described above, the motor control apparatus 200 uses the driving circuit 1 according to the embodiment. This ensures that driving power is supplied to the motor with decreased switching losses while a surge is eliminated or minimized at the motor terminals.

As used herein, the term "perpendicular" means substantially or approximately perpendicular within some design tolerance or manufacturing tolerance, as well as precisely perpendicular. As used herein, the term "parallel" means substantially or approximately parallel within some design tolerance or manufacturing tolerance, as well as precisely parallel. As used herein, the term "planar" means substantially or approximately planar within some design tolerance or manufacturing tolerance, as well as precisely planar.

Also, when the terms "same", "equal", and "different" are used in the context of dimensions or sizes of external appearance, these terms may not necessarily mean "same", "equal", and "different", respectively, in a strict sense. Specifically, the terms "same", "equal", and "different" mean "approximately same", "approximately equal", and "approximately different", respectively, with design-related and production-related tolerance and error taken into consideration.

Otherwise, the above-described embodiments and modifications may be combined in any manner deemed suitable.

As used herein, the term "comprise" and its variations are intended to mean open-ended terms, not excluding any other elements and/or components that are not recited herein. The same applies to the terms "include", "have", and their variations.

As used herein, a component suffixed with a term such as "member", "portion", "part", "element", "body", and "structure" is intended to mean that there is a single such component or a plurality of such components.

As used herein, ordinal terms such as "first" and "second" are merely used for distinguishing purposes and there is no other intention (such as to connote a particular order) in using ordinal terms. For example, the mere use of "first element" does not connote the existence of "second element"; otherwise, the mere use of "second element" does not connote the existence of "first element".

As used herein, approximating language such as "approximately", "about", and "substantially" may be applied to modify any quantitative representation that could permissibly vary without a significant change in the final result obtained. All of the quantitative representations recited in the present application shall be construed to be modified by approximating language such as "approximately", "about", and "substantially".

As used herein, the phrase "at least one of A and B" is intended to be interpreted as "only A", "only B", or "both A and B".

Obviously, numerous modifications and variations of the present invention are possible in light of the above teachings. It is therefore to be understood that within the scope of the appended claims, the present invention may be practiced otherwise than as specifically described herein.

What is claimed is:

1. A driving circuit for a semiconductor circuit including a pair of main terminals through which a main current is conducted and a control terminal to which a control voltage is applied to control a circulation state of the main current, comprising:
   driving voltage switching circuitry configured to receive a control signal, instruct switching between driving voltages based on a change in the control signal, and output a driving voltage, among the driving voltages, that has been selected in the switching;
   low-speed control circuitry configured to instruct an increase-decrease change in the control voltage at a low speed;
   speed-increase control circuitry configured to execute a speed-increase control of increasing a speed of the increase-decrease change made by the low-speed control circuitry; and
   speed-increase switching circuitry configured to instruct switching between an execution and a non-execution of the speed-increase control, and instruct switching between levels of a speed-increase change caused by the speed-increase control.

2. The driving circuit according to claim 1, wherein the speed-increase switching circuitry is further configured to instruct the switching between the execution and the non-execution of the speed-increase control at a switching tuning in which a predetermined period of time has passed since the driving voltage switching circuitry instructed the switching between the driving voltages.

3. The driving circuit according to claim 2, wherein the switching timing is set during an increase-decrease change period that is a period of time during which an inter-main-terminal voltage, between the pair of main terminals of the semiconductor circuit, is increased or decreased.

4. The driving circuit according to claim 3, wherein when the semiconductor circuit is turned ON, the speed-increase switching circuitry is further configured to, at the switching timing, instruct the switching of the speed-increase control, executed by the speed-increase control circuitry, from the execution to the non-execution.

5. The driving circuit according to claim 4, wherein the speed-increase switching circuitry is further configured to detect an increase-decrease change state of the main current, and instruct, when the increase-decrease change state has been detected, switching to increase the speed-increase change in the speed-increase control executed by the speed-increase control circuitry.

6. The driving circuit according to claim 5, wherein the speed-increase switching circuitry further comprises conduction detection circuitry including a pattern wiring provided on a circuit substrate and surrounding an axis of a conduction direction of the main terminal.

7. The driving circuit according to claim 3, wherein when the semiconductor circuit is turned OFF, the speed-increase switching circuitry is further configured to, at the switching timing, instruct the switching of the speed-increase control, executed by the speed-increase control circuitry, from the non-execution to the execution.

8. The driving circuit according to claim 7, wherein the speed-increase switching circuitry is further configured to detect an increase-decrease change state of the main current, and instruct, when the increase-decrease change state has been detected, switching to increase the speed-increase change in the speed-increase control executed by the speed-increase control circuitry.

9. The driving circuit according to claim 8, wherein the speed-increase switching circuitry further comprises conduction detection circuitry including a pattern wiring provided on a circuit substrate and surrounding an axis of a conduction direction of the main terminal.

10. The driving circuit according to claim 3, wherein the speed-increase switching circuitry is further configured to detect an increase-decrease change state of the main current, and instruct, when the increase-decrease change state has been detected, switching to increase the speed-increase change in the speed-increase control executed by the speed-increase control circuitry.

11. The driving circuit according to claim 10, wherein the speed-increase switching circuitry further comprises conduction detection circuitry including a pattern wiring provided on a circuit substrate and surrounding an axis of a conduction direction of the main terminal.

12. The driving circuit according to claim 2, wherein the speed-increase switching circuitry is further configured to detect an increase-decrease change state of the main current, and instruct, when the increase-decrease change state has been detected, switching to increase the speed-increase change in the speed-increase control executed by the speed-increase control circuitry.

13. The driving circuit according to claim 12, wherein the speed-increase switching circuitry further comprises conduction detection circuitry including a pattern wiring provided on a circuit substrate and surrounding an axis of a conduction direction of the main terminal.

14. The driving circuit according to claim 1, wherein the speed-increase switching circuitry is further configured to detect an increase-decrease change state of the main current, and instruct, when the increase-decrease change state has been detected, switching to increase the speed-increase change in the speed-increase control executed by the speed-increase control circuitry.

15. The driving circuit according to claim 14, wherein the speed-increase switching circuitry further comprises conduction detection circuitry including a pattern wiring provided on a circuit substrate and surrounding an axis of a conduction direction of the main terminal.

16. The driving circuit according to claim 14, wherein the speed-increase switching circuitry further comprises conduction detection circuitry including a magnetic core surrounding an axis of a conduction direction of a pattern wiring of the main current provided on a circuit substrate, and a pattern wiring provided on the circuit substrate and surrounding an axis of a magnetization direction of the magnetic core.

17. The driving circuit according to claim 1, wherein the low-speed control circuitry comprises a control resistor configured to limit a current through the control terminal causing a speed-increase change to be smaller than the speed-increase change in the speed-increase control executed by the speed-increase control circuitry.

18. The driving circuit according to claim 1, wherein the speed-increase control circuitry comprises a semiconductor switching circuit configured to control a switching between an application and a non-application of a current to the control terminal and to control an amount of the current.

19. A motor control apparatus, comprising:
a semiconductor circuit configured to perform a power conversion of DC power into AC power supplied to a motor, and including a pair of main terminals through which a main current is conducted, and a control terminal to which a control voltage is applied to control a circulation state of the main current;
a driving circuit configured to drive the semiconductor circuit and including driving voltage switching circuitry configured to receive a control signal, instruct switching between driving voltages based on a change in the control signal, and output a driving voltage, among the driving voltages, that has been selected in the switching, low-speed control circuitry configured to instruct an increase-decrease change in the control voltage at a low speed, speed-increase control circuitry configured to execute a speed-increase control of increasing a speed of the increase-decrease change made by the low-speed control circuitry, and speed-increase switching circuitry configured to instruct switching between an execution and a non-execution of the speed-increase control, and instruct switching between levels of a speed-increase change caused by the speed-increase control; and
control circuitry configured to output the control signal,
wherein the semiconductor circuit is further configured to perform the power conversion by controlling the circulation state of the main current.

20. A method for driving a semiconductor circuit including a pair of main terminals through which a main current is conducted and a control terminal to which a control voltage is applied to control a circulation state of the main current, comprising:
receiving a control signal;
switching between driving voltages based on a change in the control signal;
outputting a driving voltage, among the driving voltages, that has been selected in the switching;
executing an increase-decrease change in the control voltage at a low speed;
switching between an execution and a non-execution of speed-increase control; and
when executing speed-increase control, increasing a speed of the executed increase-decrease change in the control voltage and switching between levels of the executed speed-increase change caused by the speed-increase control.

* * * * *